(12) United States Patent
Cheng et al.

(10) Patent No.: US 10,256,321 B2
(45) Date of Patent: Apr. 9, 2019

(54) SEMICONDUCTOR DEVICE INCLUDING ENHANCED LOW-K SPACER

(71) Applicant: International Business Machines Corporation, Armonk, NY (US)

(72) Inventors: Kangguo Cheng, Schenectady, NY (US); Zuoguang Liu, Schenectady, NY (US); Chun W. Yeung, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 243 days.

(21) Appl. No.: 15/241,707

(22) Filed: Aug. 19, 2016

(65) Prior Publication Data
US 2018/0053830 A1 Feb. 22, 2018

(51) Int. Cl.
H01L 29/66 (2006.01)

(52) U.S. Cl.
CPC ...... H01L 29/6656 (2013.01); H01L 29/6653 (2013.01)

(58) Field of Classification Search
CPC ......... H01L 27/11502; H01L 27/11507; H01L 27/11504; H01L 27/1085
USPC .................. 257/421, 295, 532, 310, 788
See application file for complete search history.

(56) References Cited

U.S. PATENT DOCUMENTS

| | | | |
|---|---|---|---|
| 6,107,667 A | 8/2000 | An et al. | |
| 6,194,748 B1 | 2/2001 | Yu | |
| 7,227,230 B2 | 6/2007 | Gambino et al. | |
| 7,838,373 B2 | 11/2010 | Giles et al. | |
| 8,222,100 B2 | 7/2012 | Cheng et al. | |
| 8,524,592 B1 | 9/2013 | Xie et al. | |
| 8,809,962 B2 | 8/2014 | Liu et al. | |
| 9,034,701 B2 | 5/2015 | Cheng et al. | |
| 9,064,948 B2 | 6/2015 | Cai et al. | |
| 9,111,746 B2 | 8/2015 | Ranjan et al. | |
| 9,129,987 B2 | 9/2015 | Wan et al. | |
| 9,190,486 B2 | 11/2015 | Xie et al. | |
| 2003/0178688 A1* | 9/2003 | Yang | H01L 21/31116 257/395 |
| 2004/0173918 A1* | 9/2004 | Kamal | H01L 27/115 257/314 |
| 2006/0220152 A1 | 10/2006 | Huang et al. | |
| 2007/0202640 A1 | 8/2007 | Al-Bayati et al. | |

(Continued)

OTHER PUBLICATIONS

Adetutu et al., "Low Dielectric Constant (Low K) Material as Spacer", IPCOM000028019D, Apr. 19, 2004.

(Continued)

*Primary Examiner* — Joseph M Galvin, III
(74) *Attorney, Agent, or Firm* — Cantor Colburn LLP; David Quinn

(57) ABSTRACT

A semiconductor device includes a semiconductor substrate including a channel region and a source/drain region, and an electrically conductive gate on an upper surface of the channel region. An electrically conductive source/drain contact is on an upper surface of the source/drain region. The semiconductor device further includes enhanced low-k spacer on an upper surface of the substrate and interposed between the electrically conductive gate and the electrically conductive source/drain contact. The enhanced low-k spacer includes a stacked arrangement of a dielectric material and a ferroelectric material.

20 Claims, 11 Drawing Sheets

(56) References Cited

U.S. PATENT DOCUMENTS

| | | |
|---|---|---|
| 2010/0096706 A1 | 4/2010 | Gambino |
| 2012/0119299 A1* | 5/2012 | Iizuka ............. H01L 21/823456 257/368 |
| 2013/0037872 A1* | 2/2013 | Sun ................... H01L 27/11504 257/295 |
| 2013/0248950 A1 | 9/2013 | Kang et al. |
| 2014/0147982 A1* | 5/2014 | Ogata ................. H01L 29/6656 438/303 |
| 2015/0357440 A1* | 12/2015 | Cheng .............. H01L 29/66795 257/401 |

OTHER PUBLICATIONS

Khan et al., "Negative capacitance in a ferroelectric capacitor", Nature materials, 14(2), 182-186 (2015).
Li et al., "Sub-60mV-swing negative-capacitance FinFET without hysteresis", IEEE Intl. Electron Devices Meeting (IEDM) pp. 22.6.1-22.6.4 (2015).
Ma, "FEDRAM: A capacitor-less DRAM based on ferroelectric-gated field-effect transistor", IEEE 6th International Memory Workshop (IMW), pp. 1-4 (2014).
Polakowski et al., "Ferroelectricity in undoped hafnium oxide", Applied Physics Letters, 106(23), pp. 232905-1 to 5, (2015).
Weber et al., "14nm FDSOI upgraded device performance for ultra-low voltage operation", IEEE Symp. on VLSI Technology, pp. T168-T169 (2015).
Yamashita et al., "A novel ALD SiBCN low-k spacer for parasitic capacitance reduction in FinFETs", IEEE Symp. on VLSI Technology, pp. T154-T155 (2015).

\* cited by examiner

SEMICONDUCTOR DEVICE INCLUDING ENHANCED LOW-K SPACER

BACKGROUND

The present invention relates in general to semiconductor device fabrication methods and resulting structures. More specifically, the present invention relates to fabrication methods and resulting structures for field effect transistors (FETs) including enhanced low-k spacer structures.

Semiconductor devices such as FETs, for example, typically include metal contacts to facilitate electrical conductivity with the gate regions and the source/drain (S/D) regions. The close proximity of the metal gate conductor to one or more of the S/D metal contacts can cause undesired parasitic capacitance. As the demand for semiconductor devices with reduced footprints continue, gate pitch dimensions are further reduced, which in turn increases the parasitic capacitance between the gate conductor and one or more of the S/D contacts.

FETs typically include a low-k dielectric spacer interposed between the gate conductor and the S/D contacts to mitigate the parasitic capacitance. Dielectric materials having low-dielectric constant (low-k) values can more effectively mitigate the parasitic capacitance. Conventional dielectric materials typically have a dielectric constant (k) ranging from about k=3 to about k=7.

SUMMARY

According to a non-limiting embodiment of the present invention, a semiconductor device includes a semiconductor substrate including a channel region and a source/drain region, and an electrically conductive gate on an upper surface of the channel region. An electrically conductive source/drain contact is on an upper surface of the source/drain region. The semiconductor device further includes enhanced low-k spacer on an upper surface of the substrate and interposed between the electrically conductive gate and the electrically conductive source/drain contact. The enhanced low-k spacer includes a stacked arrangement of a dielectric material and a ferroelectric material.

According to another non-limiting embodiment, a field effect transistor (FET) including enhanced low-k spacers, the FET comprises a semiconductor substrate having a channel region interposed between a first source/drain region and a second source/drain region. An electrically conductive gate is on an upper surface of the channel region. A first electrically conductive source/drain contact is on an upper surface of the first source/drain region, and a second electrically conductive source/drain contact is on an upper surface of the second source/drain region. The FET further includes first and second stacked arrangements of dielectric materials to form enhanced low-k spacer stacks. The first stacked arrangement of a dielectric material and a ferroelectric material is interposed between the first electrically conductive source/drain contact and the electrically conductive gate that defines a first enhanced low-k spacer. A second stacked arrangement of a dielectric material and a ferroelectric material is interposed between the second electrically conductive source/drain contact and the electrically conductive gate that defines a second enhanced low-k spacer.

According to yet another non-limiting embodiment, a method of fabricating a semiconductor device including an enhanced low-k spacer comprises forming a semiconductor substrate including a channel region and a source/drain region. The method further includes forming an electrically conductive gate on an upper surface of the channel region. The method further includes forming an electrically conductive source/drain contact on an upper surface of the source/drain region. The method further includes stacking together a dielectric material and a ferroelectric material between the electrically conductive gate and the electrically conductive source/drain contact to form the enhanced low-k spacer.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

FIGS. 3-5 are a series of views illustrating a method of fabricating a semiconductor device including an enhanced low-k spacer in which:

FIG. 3 is a cross-sectional view of a semiconductor device existing at an intermediate stage of a fabrication process for forming a semiconductor device including an enhanced low-k spacer according to a non-limiting embodiment;

FIG. 4 is a cross-sectional view of the semiconductor device illustrated in FIG. 3 following a selective etching process to recess a portion of the gate spacers interposed between a gate conductor and respective source/drain contacts to form spacer trenches; and FIG. 5 is a cross-sectional view of the semiconductor device illustrated in FIG. 4 after filling the spacer trenches with a ferroelectric material to form enhanced low-k spacers.

FIGS. 6-8 are a series of views illustrating a method of fabricating a semiconductor device including an enhanced low-k spacer according to another non-limiting embodiment in which:

FIG. 6 is a cross-sectional view of an intermediate semiconductor device following a first selective etching process that partially recesses inter-layer dielectrics formed on sidewalls of respective gate spacers;

FIG. 7 is a cross-sectional view of the intermediate semiconductor device shown in FIG. 6 following a second selective etching process that partially etches the gate spacers such that an upper surface of the gate spacers is flush with an upper surface of the inter-layer dielectrics to form respective spacer trenches; and FIG. 8 is a cross-sectional view of the intermediate semiconductor device shown in FIG. 7 after filling the spacer trenches with a ferroelectric material to form enhanced low-k spacers.

FIGS. 9-11 are a series of views illustrating a method of fabricating a semiconductor device including an enhanced low-k spacer according to yet another non-limiting embodiment in which:

FIG. 9 is a cross-sectional view of an intermediate semiconductor device following a gate-first formation process to form an electrically conductive gate on an upper surface of a semiconductor substrate;

FIG. 10 is a cross-sectional view of the intermediate semiconductor device shown in FIG. 9 after forming gate spacer stacks on sidewalls of the gate conductor; and FIG. 11 is a cross-sectional view of the intermediate semiconductor device shown in FIG. 10 after replacing a portion of the gate dielectric included in the gate spacer stack with a ferroelectric material to form enhanced low-k spacers.

DETAILED DESCRIPTION

Figure 1:
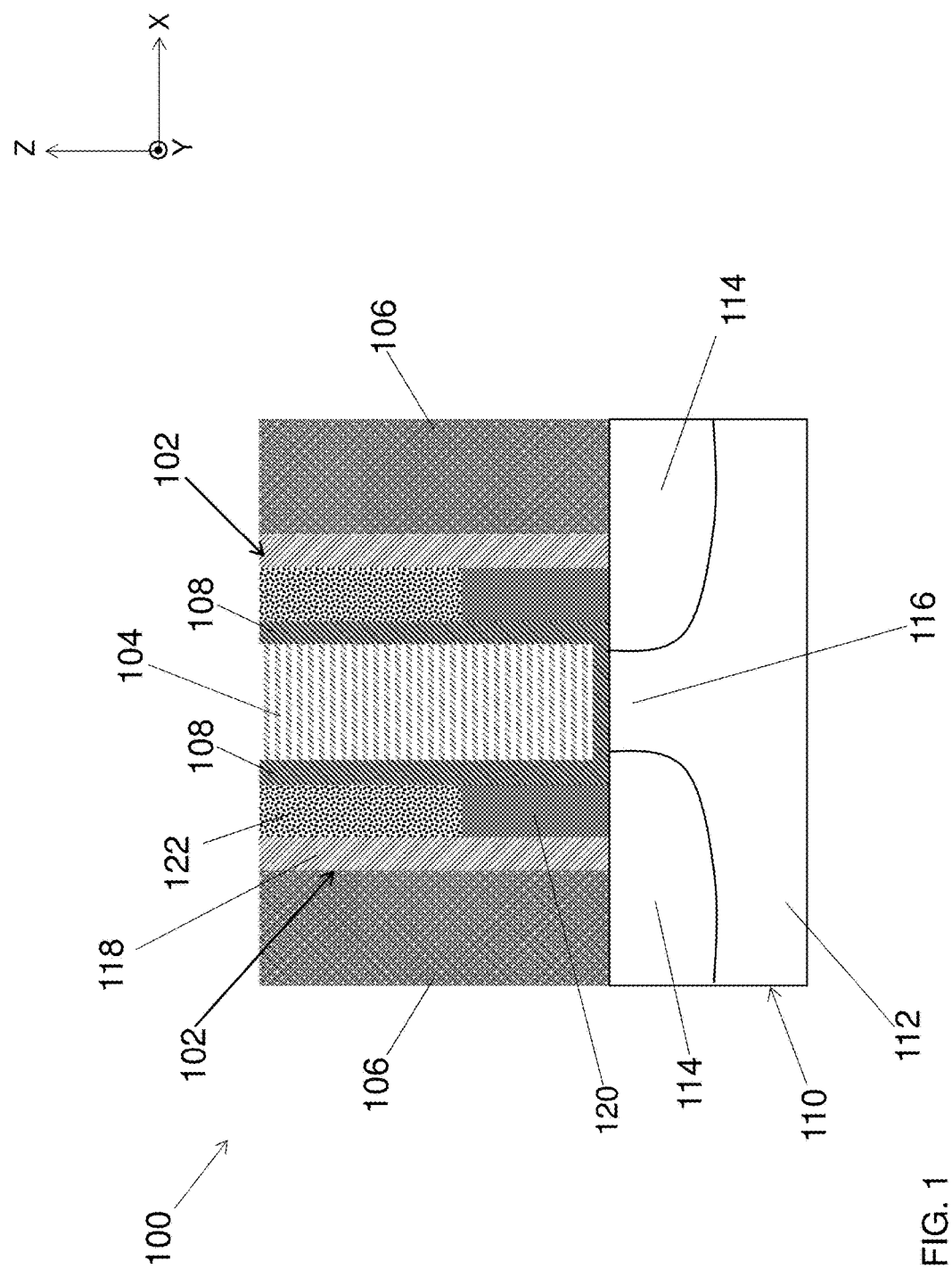
FIG. 1 illustrates a semiconductor device including an enhanced low-k spacer according to a non-limiting embodiment.

Various embodiments of the present invention are described herein with reference to the related drawings. Alternative embodiments are be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities refers to either a direct or an indirect coupling, and a positional relationship between entities can be a direct or indirect positional relationship. As an example of an indirect positional relationship, references in the present invention to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The term "exemplary" is used herein to mean "serving as an example, instance, or illustration." Any embodiment or design described herein as "exemplary" is not necessarily to be construed as preferred or advantageous over other embodiments or designs. The terms "at least one" and "one or more" can be understood to include any integer number greater than or equal to one, i.e. one, two, three, four, etc. The terms "a plurality" can be understood to include any integer number greater than or equal to two, i.e. two, three, four, five, etc. The term "connection" can include both an indirect "connection" and a direct "connection."

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that are utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a coupler system according to the present invention utilize a variety of individually known physical and chemical processes performed on a semiconductor (e.g., silicon) substrate. In general, the various processes used to form a micro-chip that will be packaged into an IC fall into three categories, namely, film deposition, patterning, etching and semiconductor doping. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to all of the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of the present invention, a semiconductor device such as a FET, for example, is provided having an enhanced low-k spacer that reduces parasitic capacitance compared to conventional FETs. One or more non-limiting embodiment, the semiconductor device includes a low-k spacer stack interposed between an electrically conductive gate and one or more electrically conductive S/D contacts. The low-k spacer stack includes a stacked arrangement of a dielectric material and a ferroelectric material. Ferroelectric materials can exhibit "negative capacitive" characteristics. Accordingly, the stacked arrangement of the dielectric material and the ferroelectric material provides an effective dielectric constant that is substantially lower than conventional dielectric materials, and even lower than the dielectric constant of air (i.e., k=1).

Turning now to a more detailed description of one or more embodiments, with reference now to FIG. 1, a completed semiconductor device structure that can be fabricated according to methodologies of the present invention is depicted as FET 100, which includes one or more enhanced low-k spacer stacks 102. Although a planar-type FET is illustrated, it should be appreciated that the enhanced low-k spacer stack 102 can be implemented in various other types of FETs including, but not limited to, a fin-type FET (i.e., a FinFET), a nanowire FET, a nanosheet FET, and a vertical FET.

An electrically conductive gate 104 is interposed between an opposing pair of electrically conductive S/D contacts 106. In one or more embodiments, a gate dielectric layer 108 lines the sidewalls and base of the gate trench, and is therefore interposed between the gate stack 104 and the enhanced low-k spacer stacks 102. The gate dielectric layer 108 can be formed from any suitable dielectric material, including but not limited to, silicon oxide, silicon nitride, silicon oxynitride, boron nitride, high-k materials (with a value of k greater than 7), or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum. The electrically conductive gate 104 and/or the electrically conductive S/D contacts 106 can be formed by depositing any suitable conducting material (e.g., a metal material) on an upper surface of a semiconductor substrate 110. For instance, the semiconductor substrate 110 includes an active semiconductor layer 112.

The active semiconductor layer 112 includes opposing S/D regions 114 that define a channel region 116 therebetween. The electrically conductive S/D contacts 106 are formed atop a respective S/D region 114, while the electrically conductive gate 104 is formed atop the channel region 116 and between the S/D contacts 106. The conductive gate and S/D contacts can be any suitable conducting material, including but not limited to, polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition. The gate conductor may further include a workfunction setting layer. The work function layer may be a nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof.

Still referring to FIG. 1, each enhanced low-k spacer stack 102 is interposed between a pair of dielectric layers. For example, each enhanced low-k spacer stack 102 is interposed between the gate dielectric layer 108 and a respective inter-layer dielectric (ILD) 118. The ILD 118 can be formed from various materials such as, for example, silicon oxide, silicon nitride, silicon oxynitride, or any suitable combination of those materials. In some embodiments, the gate dielectric layer 108 can be removed from the sidewalls of the gate conductor 104 and replaced with a second low-k dielectric layer composed of SiN, for example. Accordingly, the dielectric layer 108 can be maintained at the base of the gate trench, between the gate conductor 104 and the channel region 116.

Each enhanced low-k spacer stack 102 includes a stacked arrangement of a dielectric layer 120 and a ferroelectric layer 122. In one or more embodiments, the dielectric stack layer 120 is formed on an upper surface of the substrate 110 while the ferroelectric stack layer 122 is formed on the upper surface of the dielectric stack layer 120. The dielectric stack layer 120 can be formed from various dielectric materials such as, for example, silicon nitride (SiN), silicon oxynitride (SiON), silicon oxycarbide (SiCO), boron doped silicon carbon nitride (SiBCN), silicon oxycarbonitride (SiOCN), etc. The ferroelectric stack layer 122 can be formed from various ferroelectric materials such as, for example, inorganic complex oxide and fluoride ferroelectrics, e.g., hafnium zirconium oxide (HfZrO$_2$), lead zirconate titanate (PZT), SrBa$_2$Ta$_2$O$_9$, PbZrTiO$_3$, Bi$_4$La$_x$Ti$_{3-x}$O$_{12}$, BiMgF$_4$, ferroelectric polymers such as polyvinylidene fluoride (PVDF) and its copolymers, e.g., trifluoroethylene, P(VDF-TrFE).

The structural relationship of the enhanced low-k spacer stack 102 and the pair of opposing dielectrics (e.g., the gate dielectric layer 108 and the ILD 118) creates a parasitic capacitance network between a respective S/D contact 106 and the gate conductor 104.

Figure 2:
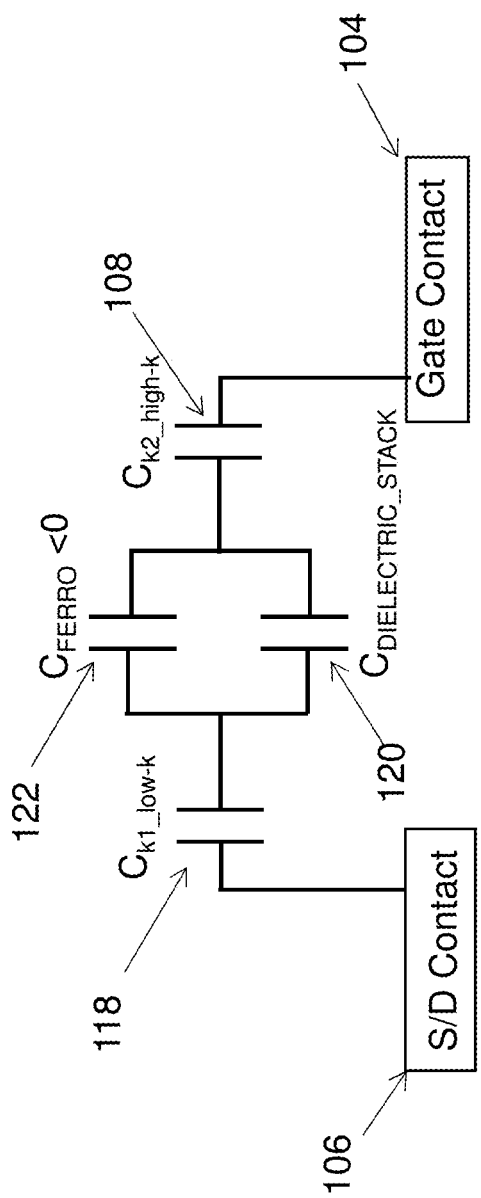
FIG. 2 is a schematic diagram illustrating an equivalent circuit of the parasitic capacitance network provided by the enhanced low-k spacer according to a non-limiting embodiment.

Turning to FIG. 2, a schematic diagram illustrates an equivalent circuit of the parasitic capacitance network between a S/D contact 106 and the gate conductor 104 provided by the enhanced low-k spacer stack 102 according to a non-limiting embodiment. The gate dielectric layer 108, the ILD 118, the dielectric stack layer 120, and the ferroelectric stack layer 122 can each be modeled as an individual capacitor. The arrangement of the dielectric stack layer 120 and the ferroelectric stack layer 122 creates a parallel capacitor network. The gate dielectric layer 108 is electrically connected between the parallel capacitor network (i.e., the dielectric stack layer 120 and the ferroelectric stack layer 122) and the gate conductor 104, while the ILD 118 is electrically connected between the parallel capacitor network and the S/D contact 106. Accordingly, the overall parasitic capacitance network between the gate conductor 104 and the S/D contact 106 can be represented as:

$$1/C_{PARASITIC} = [1/C_{k1\_low-k} + 1/C_{k2\_High-k} + 1/C_{FERRO} + C_{GATE\_SPACER})] \quad \text{[Equation 1]}$$

Based on Equation 1 above and the equivalent circuit illustrated in FIG. 2, when the capacitance of the ferroelectric stack layer 122 is less than zero (i.e., $C_{FERRO} < 0$), and the capacitance of the ILD 118 is greater than zero (i.e., $C_{k1\_low-k} > 0$), and if the absolute value of the ferroelectric stack layer capacitance equals the absolute value of the dielectric stack layer capacitance (i.e., $|C_{FERRO}| = |C_{GATE\_SPACER}|$), than the total capacitance of the enhanced low-k spacer stack 102 (i.e., $C_{FERRO} + C_{GATE\_SPACER}$) is zero or is approximately zero.

The absolute value of the ferroelectric stack layer capacitance $|C_{FERRO}|$ can be set equal to the absolute value of the dielectric stack layer capacitance $|C_{GATE\_SPACER}|$ by tuning the dimensions of the enhanced low-k spacer stack 102 or tuning the dielectric constant of the enhanced low-k spacer stack 102. For instance, a ratio between the height (distance along the Z-axis) of the ferroelectric stack layer 122 with respect to the height of the dielectric stack layer 120 can be tuned or adjusted. In another example, different dielectric materials of the dielectric stack layer 120 and/or the ferroelectric material 122 can be employed, which effectively allows the absolute value of the ferroelectric stack layer 122 capacitance $|C_{FERRO}|$ to be set equal to the absolute value of the dielectric stack layer 120 capacitance $|C_{GATE\_SPACE}|$.

Based on the overall parasitic capacitance network described in Equation 1, bringing the total capacitance ($C_{FERRO} + C_{GATE\_SPACER}$) of the enhanced low-k spacer stack 102 to zero results in the following overall relationship:

$$1/(C_{FERRO} + C_{GATE\_SPACER}) \sim \infty \quad \text{[Equation 2]}$$

Thus, as the total capacitance of the enhanced low-k spacer stack 102 (i.e., $C_{FERRO} + C_{GATE\_SPACER}$) is brought to zero, the following relationship is realized:

$$1/C_{PARASITIC} = \sim \infty \quad \text{[Equation 3]}$$

Accordingly, solving for $C_{PARASITIC}$ results in the following solution:

$$1/C_{PARASITIC} = \sim \infty \rightarrow C_{PARASITIC} = 1/\infty \rightarrow C_{PARASITIC} = \sim 0 \quad \text{[Equation 4]}$$

As described above, the enhanced low-k spacer stack 102 can be formed with a dielectric constant that is substantially lower than conventional dielectrics (i.e., lower than k=3 to k=5), and in some instances can achieve a parasitic capacitance of about zero. Therefore, the total dielectric constant of the enhanced low-k spacer stack 102 is lower than the dielectric constant of air (k=1), and can be effectively be viewed as having a dielectric constant of approximately k=0.

Figure 3:
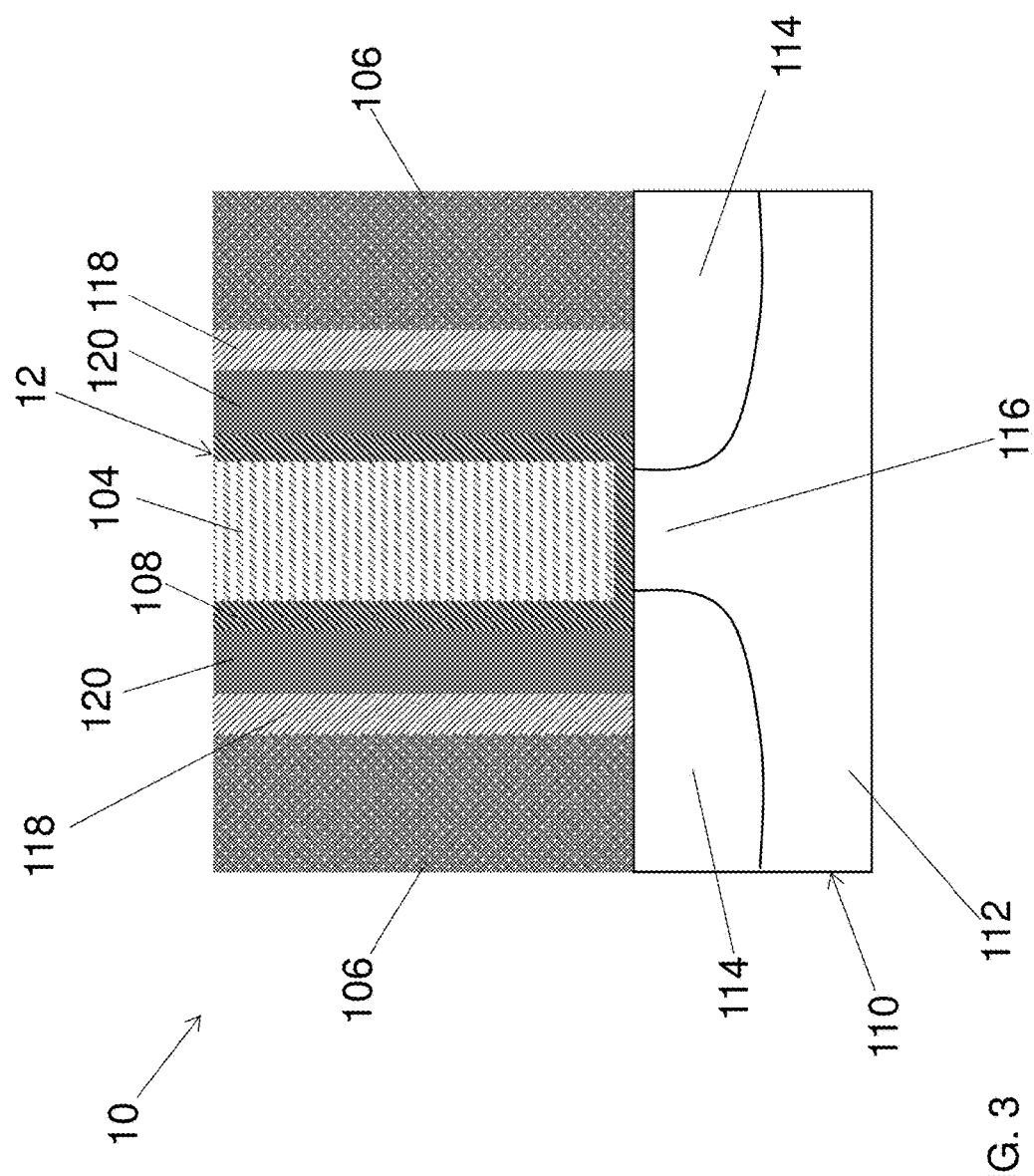
Figure 4:
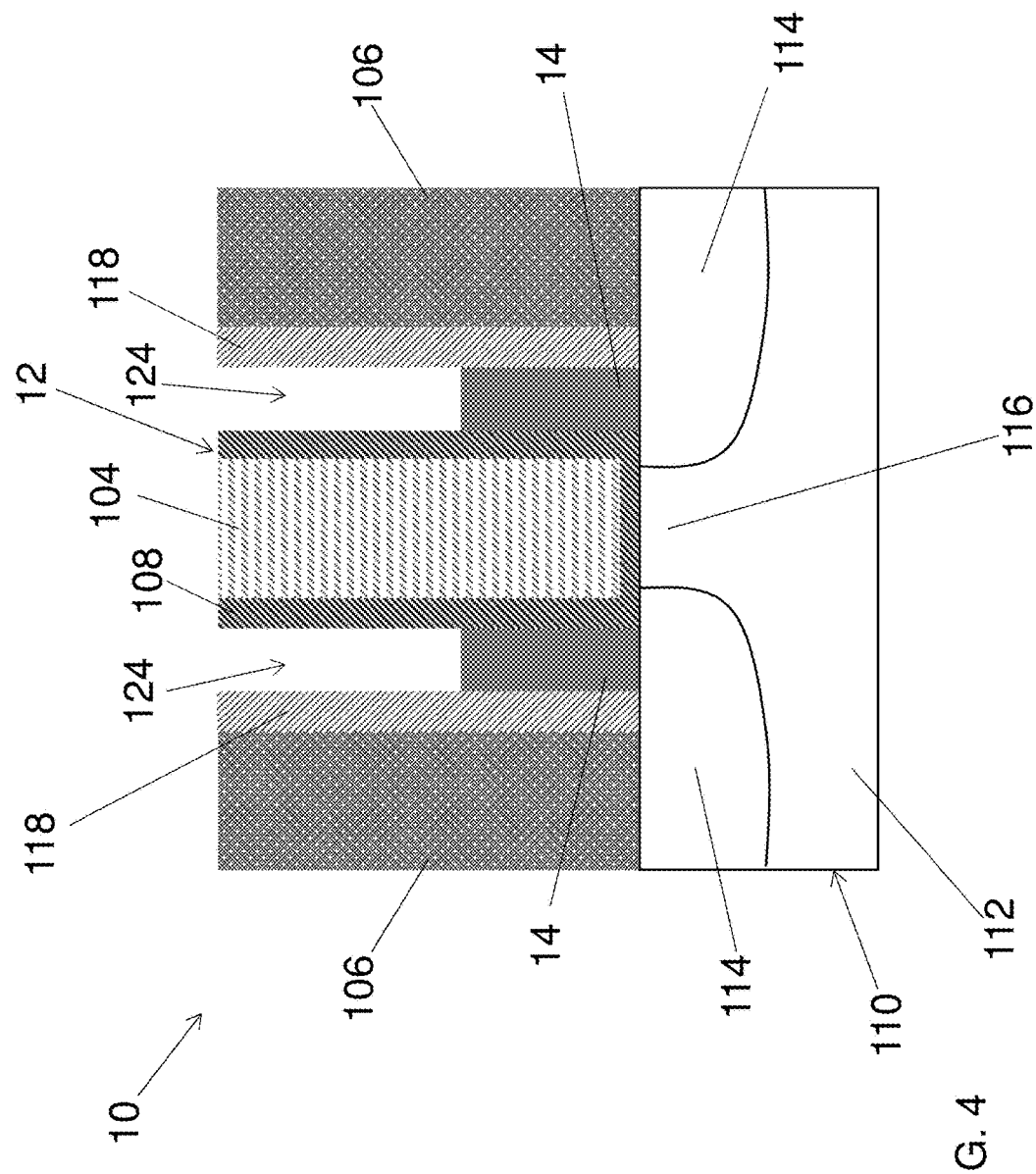
Figure 5:
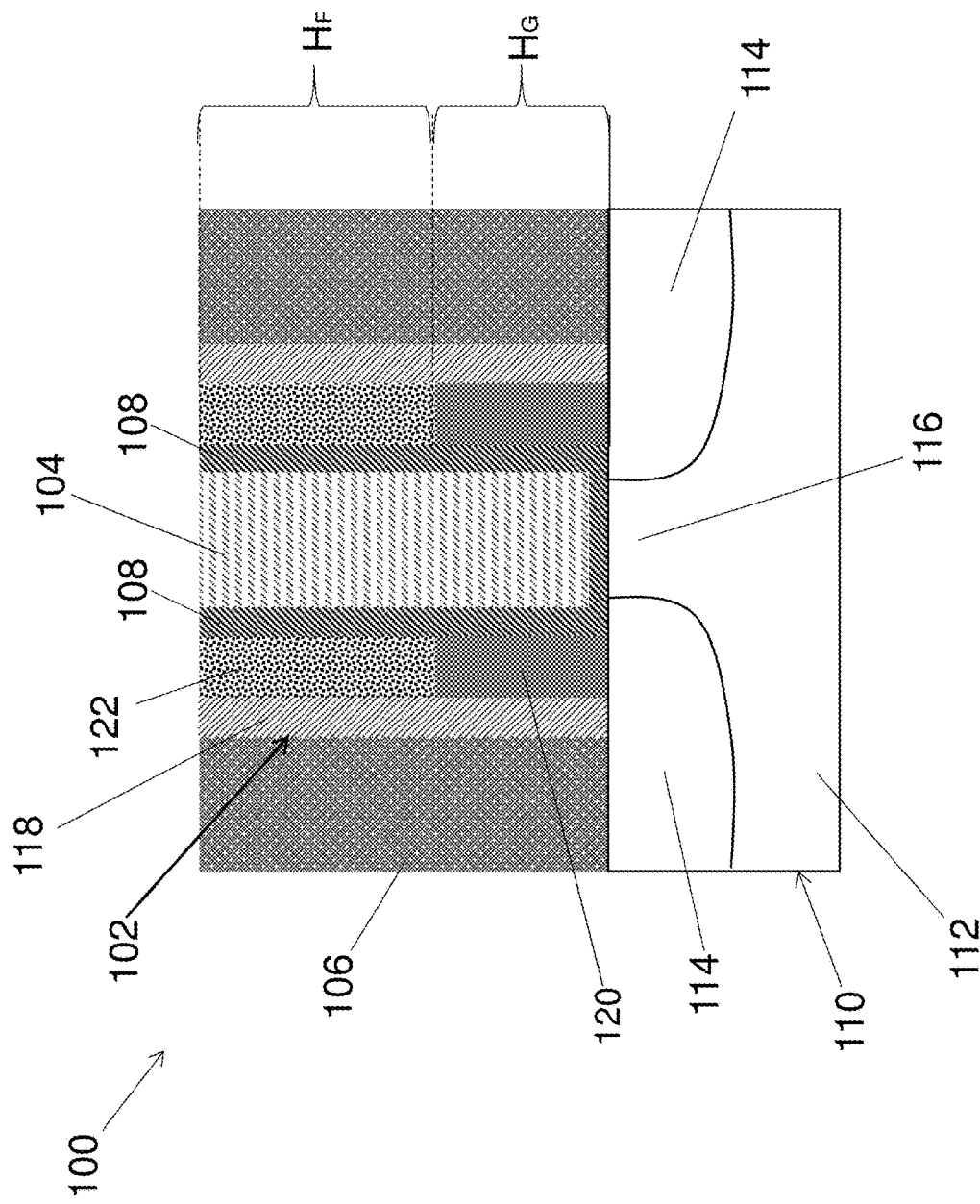

Turning now to FIGS. 3-5, a process flow of forming a semiconductor device including an enhanced low-k spacer stack capable of achieving an effective dielectric constant of approximately zero will be described according to various non-limiting embodiments.

With reference to FIG. 3, an intermediate semiconductor device 10 such as a FET, for example, is illustrated according to a non-limiting embodiment. The semiconductor device 10 includes a semiconductor substrate 110 having an active semiconductor layer 112. The active semiconductor layer 112 includes opposing S/D regions 114 that define a channel region 116 therebetween.

The semiconductor device 10 further includes a gate stack 12 formed between an opposing pair of gate spacers 120. The gate stack 12 includes an electrically conductive gate 104 and a gate dielectric 108. Various dielectric materials may be used to from the gate spacers including, but not limited to, SiN and SiBCn. In some embodiments, the gate dielectric 108 includes a high-k material (e.g., $HfO_2$) that is formed against the inner sidewalls of the gate spacers 120, and extends along an upper surface of the substrate 110 between the spacers 120. The thickness of the gate dielectric 108 ranges, for example, from approximately 1 nanometers (nm) to approximately 5 nm.

The gate conductor 104 can be formed according to a replacement metal gate (RMG) process. For instance, prior to forming the gate stack 12, a dummy gate (not shown) is formed atop the substrate 110, and the gate spacers 120 are formed against the dummy gate. The dummy gate is then removed thereby defining a gate trench between the gate spacers 120. The gate dielectric 108 is deposited to line the gate trench, and an electrically conductive material such as tungsten (W), for example, is then deposited in the gate trench to form the gate conductor 104. In this manner, the gate conductor 104 is separated from the gate spacers 120 and the substrate 110 via the gate dielectric 108. The gate conductor 104 has a thickness (e.g. extending along the X-axis) ranging, for example, from approximately 15 nm to approximately 80 nm. Other suitable gate fill materials include, but are not limited to, polycrystalline or amorphous silicon, germanium, silicon germanium, a metal (e.g., titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition. The gate conductor may further include a workfunction setting layer. The work function layer may be a nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof.

The gate spacers 120 have a low-k material composition and are formed on an upper surface of the substrate 100. A low-k material typically has a dielectric constant (k) equal or less than 7. In one or more embodiments, the low-k material forming the gate spacers 120 is a low-k ceramic dielectric such as SiBCN, SiCO, SiOCN, SiON, for example, which has a dielectric constant of between 4 and 5. The thickness of the gate spacers 120 ranges, for example, from approximately 2 nm to approximately 8 nm. The height (e.g., extending along the Z-axis) gate spacers 120 can range from approximately 10 nm to approximately 50 nm. The inner sidewalls of the gates spacers 120 are formed against a portion of the gate dielectric 108. The outer sidewalls of the gate spacers 120 are formed against an ILD 118.

The ILD liner 118 can be formed from various materials such as, for example, silicon nitride (SiN). The ILD liner 118 is formed atop the substrate 110 and is interposed between the gate spacers 120 and a respective S/D contact 106. The thickness of the ILD 118 ranges, for example, from approximately 1 nm to approximately 8 nm. The S/D contacts 106 are composed of an electrically conductive material which can be formed atop a respective S/D region 106 using a suitable contact formation processes.

Turning to FIG. 4, the semiconductor device 10 is illustrated after recessing a portion of the gate spacers 120 which form spacer trenches 124. Various selective etching techniques are known to achieve high etching selectivity of the gate spacer material relative to the remaining materials of the device 10 (e.g., the gate conductor 104, gate dielectric 108, ILDs 118 and the S/D contacts 106). In some embodiment, the gate spacer material can be etched by a dry etch process. In some embodiments, the gate spacer material can be etched by a wet etch process. In some embodiments, a combination of dry and wet etch processes are used to etch the gate spacer material. A timed etching procedure can be used to recess the gate spacers 120 to a desired depth which will form the dielectric stack layer 120 of the enhanced low-k spacer stack 102 described herein. The recessed depth is application specific and is based on the materials selected for the initial gate spacers 120 and the subsequently deposited ferroelectric stack layer 122 (not shown in FIG. 4).

Referring now to FIG. 5, a completed semiconductor device 100 is illustrated after filling the spacer trenches 124 with a ferroelectric material to form a ferroelectric stack layer 122. An atomic layer deposition (ALD) process can be used to deposit the ferroelectric material which includes, for example, $HfZrO_2$. Accordingly, a portion of the gate spacers 120 is replaced with a ferroelectric material such that a ferroelectric stack layer 122 is stacked atop a dielectric stack layer 120.

In some instances, the ferroelectric material can be deposited to fill the spacer trenches 124 and cover the upper surface of the device 100. In this instance, a chemical-mechanical planarization (CMP) process can be performed to remove the ferroelectric material from the upper surface of the device 100 while stopping on an upper surface of the gate conductor 104. Accordingly, the upper surface of the ferroelectric stack layer 122 is formed flush with the gate dielectric 108 and a respective ILD 118. The stacked arrangement of the dielectric stack layer 120 and the ferroelectric stack layer 122 forms an enhanced low-k spacer stack 102.

As described above, the height ($H_G$) of the dielectric stack layer 120 with respect to the height ($H_F$) of the ferroelectric stack layer 122 can vary depending on the type of materials for each stack layer 120, 122. For instance, the embodiment illustrated in FIG. 5 shows the height ($H_F$) of the ferroelectric stack layer 122 being greater than the height ($H_G$) of the dielectric stack layer 120. It should be appreciated, however, that different materials of the dielectric stack layer 120 and/or ferroelectric stack layer 122 can lead to the height ($H_F$) of the ferroelectric stack layer 122 being less than (or even substantially equal to) the height ($H_G$) of the dielectric stack layer 120. In any case, the height of the dielectric stack layer 120 and the height of the ferroelectric stack layer 122 are tuned or adjusted such that the absolute value of the dielectric stack layer 120 capacitance $|C_{GATE\_SPACER}|$ equals the absolute value of the ferroelectric stack layer 122 $|C_{FERRO}|$.

Figure 6:
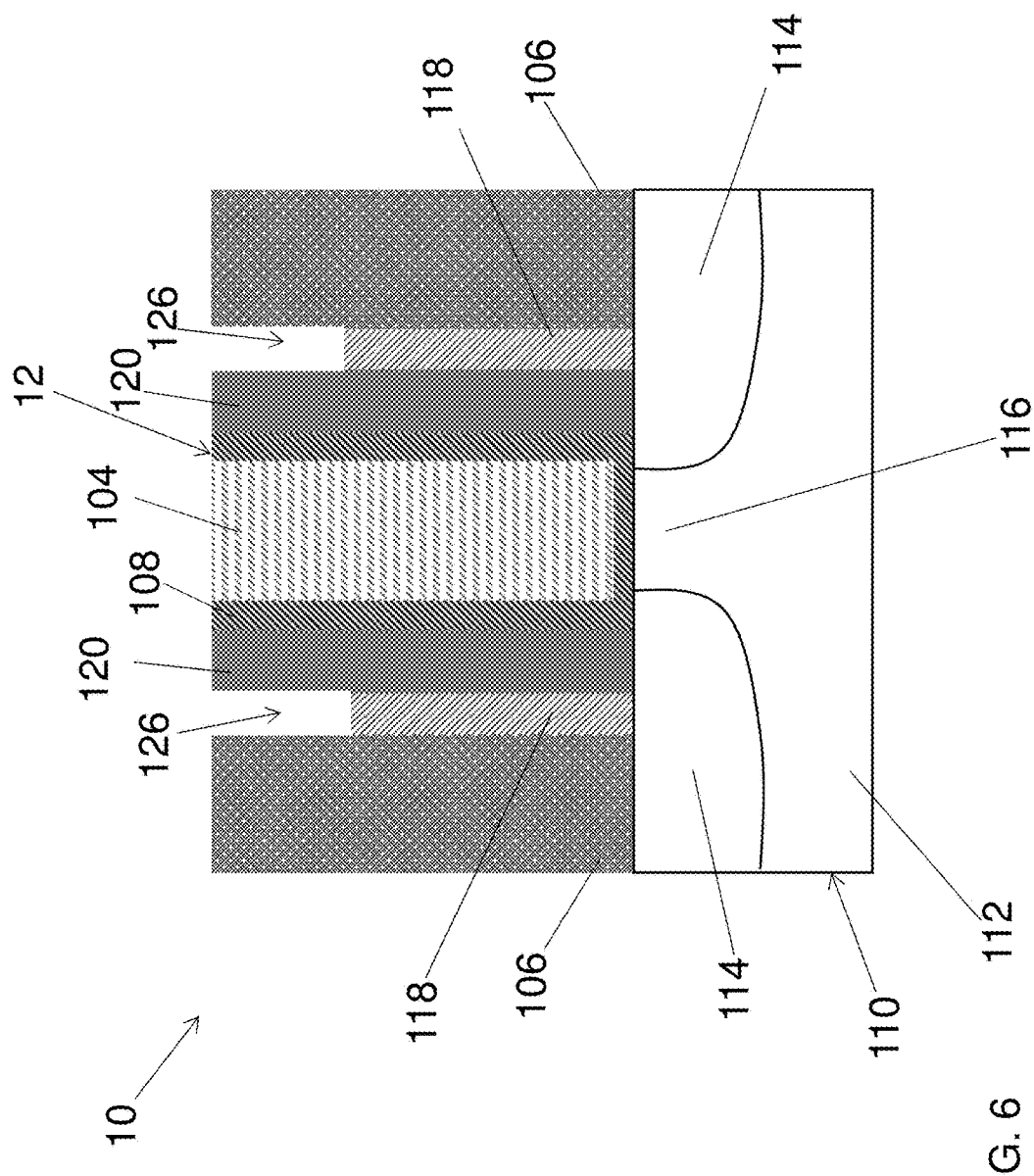

Turning to FIG. 6, a variation in the process flow is illustrated which provides an alternative method of forming the ferroelectric stack layer 122. The ILDs 118 are first partially recessed to expose a portion of the gate spacers 120. Various selective etching techniques are known to achieve high etching selectivity of the ILD material (e.g., SiN) relative to the remaining materials of the device 10 (i.e., the gate conductor 104, gate dielectric 108, the gate spacers 120, and the S/D contacts 106). In some embodiments, the ILDs 118 are etched by a dry etch process comprising tetrafluoro methane (CF4). In some embodiments, the ILDs 118 are etched by a wet etch process. Accordingly, ILD gaps 126 are formed which provide access to a portion of the gate spacers 120.

Figure 7:
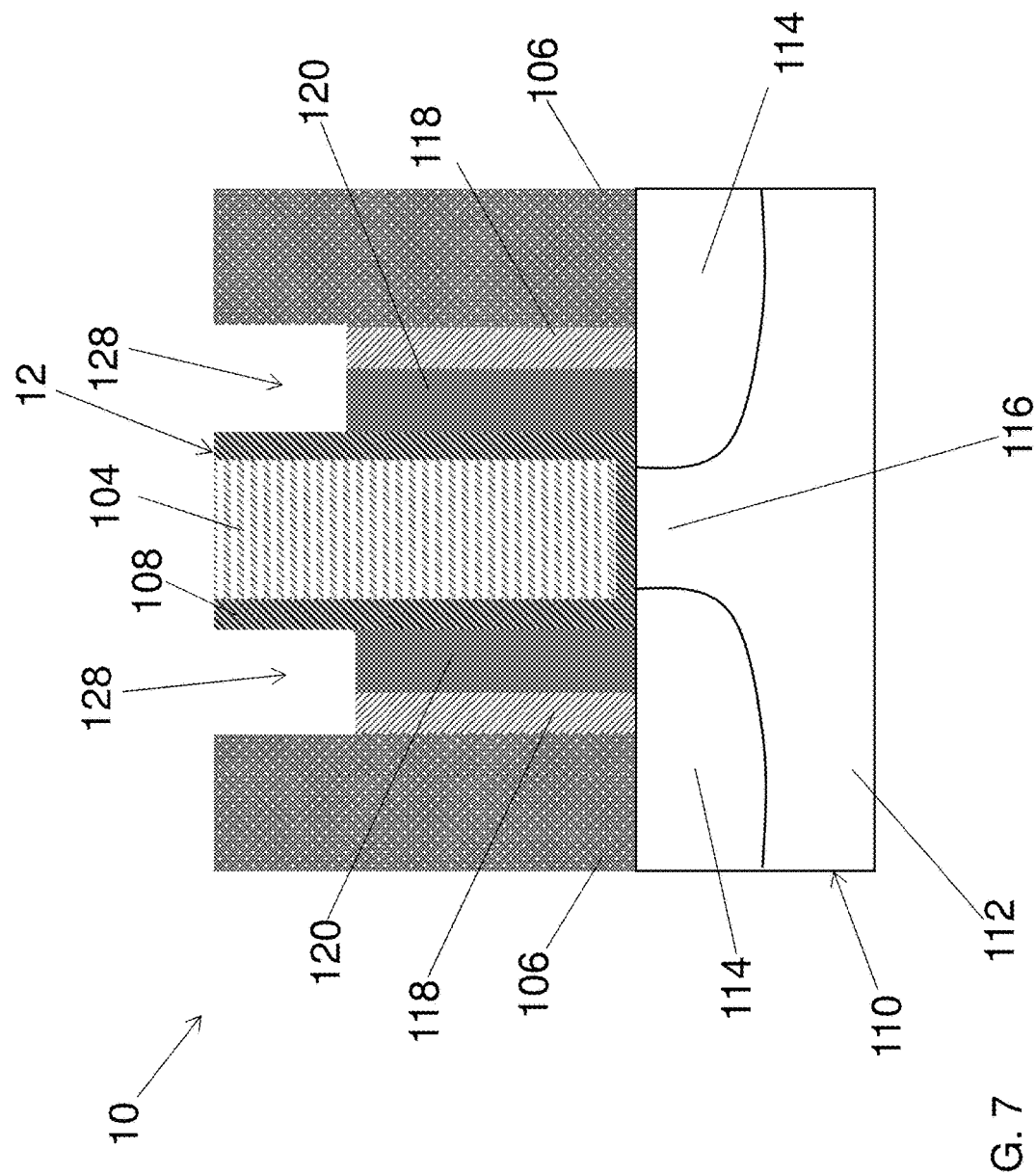

Turning to FIG. 7, the exposed portion of the gate spacers 120 is etched away to form voids 128 between the S/D contacts 106 and the gate dielectric 108. Various selective etching techniques are known to achieve high etching selectivity of the gate spacer material relative to the remaining materials of the device 10 (i.e., the gate conductor 104, gate dielectric 108, ILDs 118, and the S/D contacts 106). In some embodiments, the ILDs 118 and the gate spacer material can be etched together.

Figure 8:
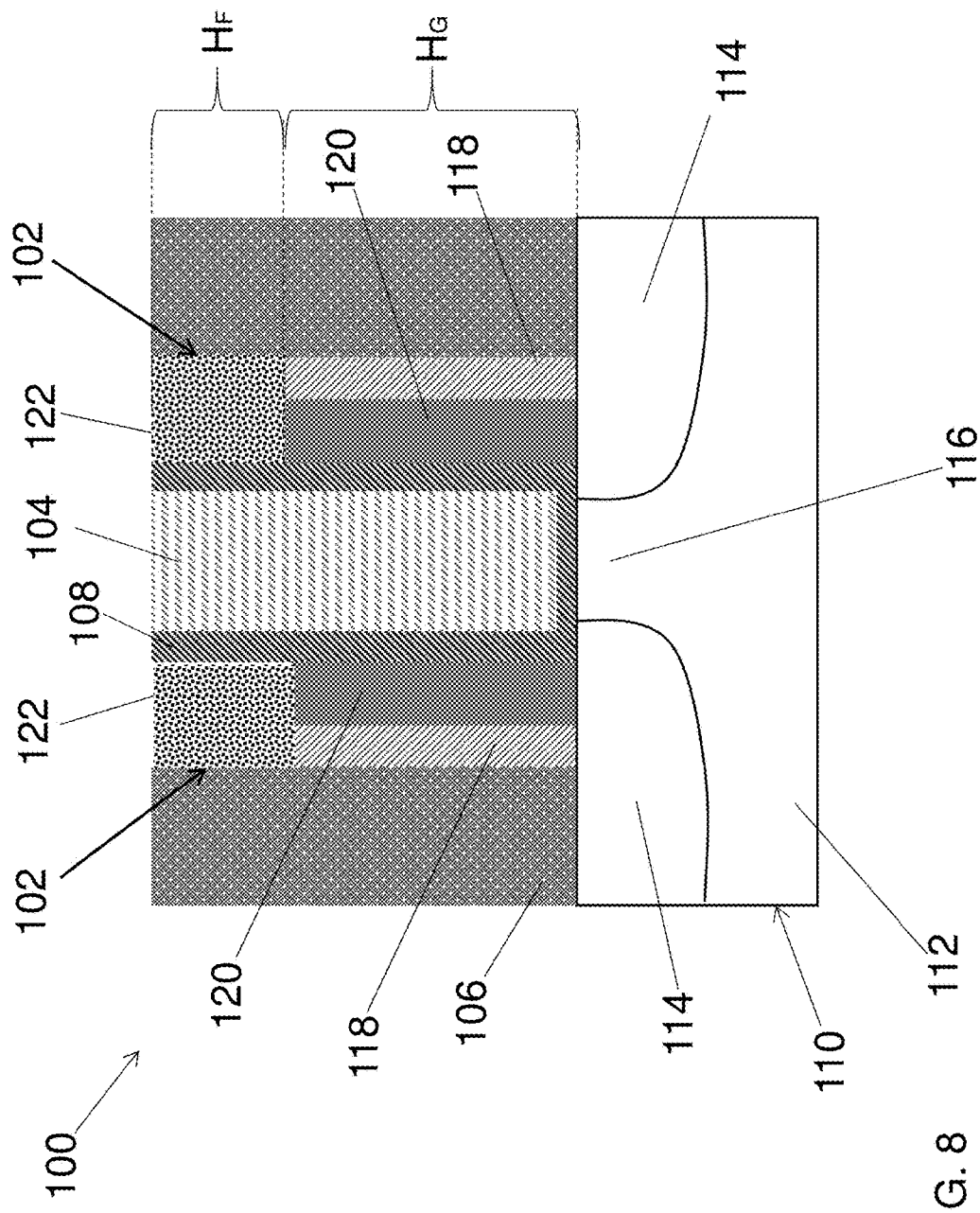

Referring to FIG. 8, a completed semiconductor device 100 (e.g., FET 100) including enhanced low-k spacer stacks 102 is illustrated after filling the voids 128 with a ferroelectric material to form a ferroelectric stack layer 122. An atomic layer deposition (ALD) process can be used to deposit the ferroelectric material which includes, for example, $HfZrO_2$. In this embodiment, it can be appreciated that the thickness (i.e., extending along the X-axis) of the ferroelectric stack layer 122 can be tuned or adjusted with respect to the thickness of the dielectric stack layer 120.

In some instances, the ferroelectric material can be deposited to fill the voids 128 and cover the upper surface of the device 100. A CMP process can then be performed to remove the ferroelectric material from the upper surface of the device 100 while stopping on an upper surface of the gate conductor 104. Accordingly, the upper surface of the ferroelectric stack layer 122 is formed flush with the gate dielectric 108 and a respective S/D contact 106. Accordingly, the arrangement of the dielectric stack layer 120 and the ferroelectric stack layer 122 forms an enhanced low-k spacer stack 102 according to another non-limiting embodiment of the invention.

Various non-limiting embodiments of the completed semiconductor device 100 described above were achieved following a RMG process that forms the gate conductor 104 after forming the initial gate spacers 120 (see e.g., FIG. 3). It is conceivable, however, that the gate conductor 104 can be formed first without departing from the scope of the invention.

Figure 9:
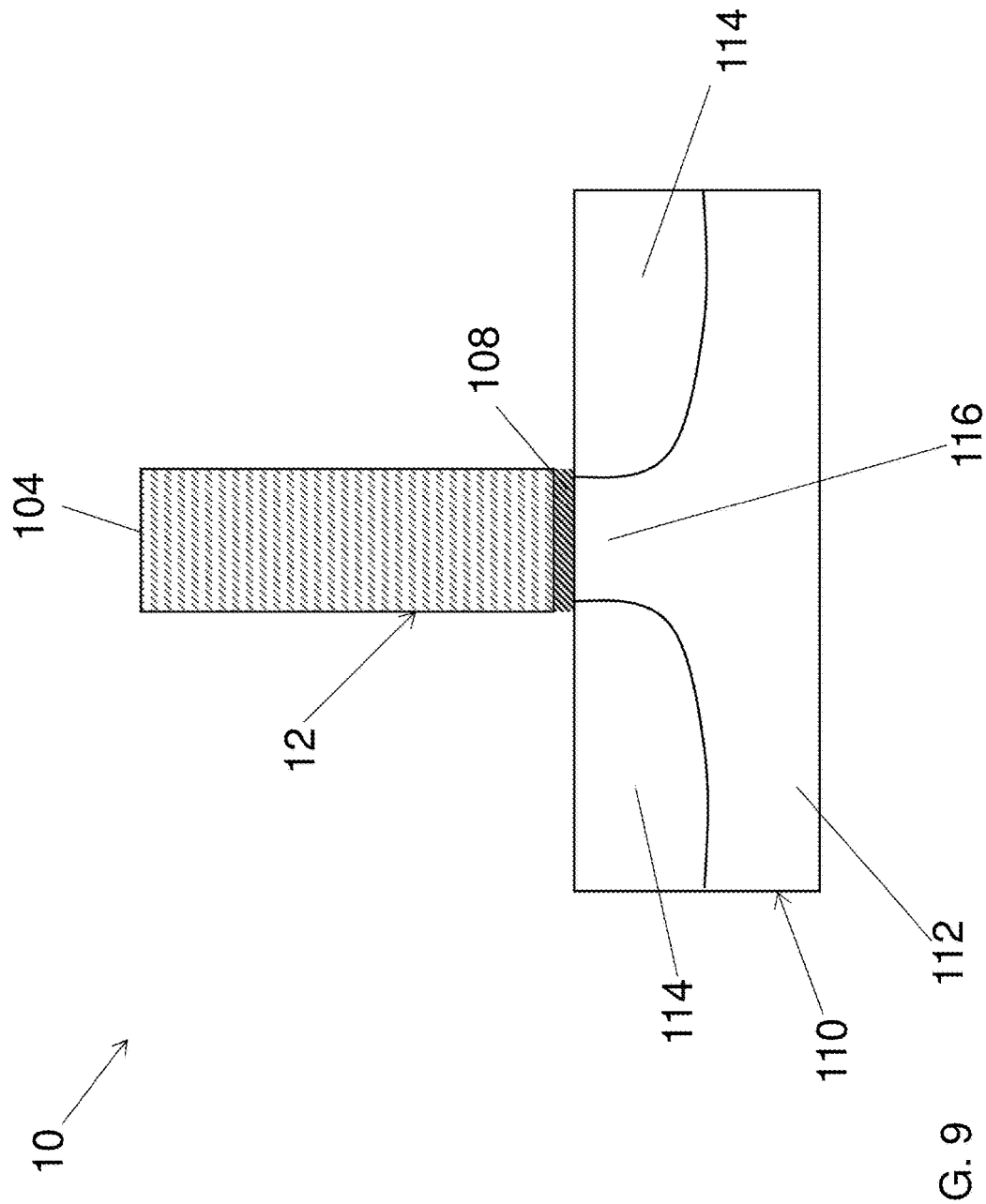

With reference now to FIG. 9, another variation in the process flow is illustrated which provides a method of forming the semiconductor device 100 including enhanced low-k spacer stack 102 according to another non-limiting embodiment. In this embodiment, the intermediate semiconductor device 10 includes a gate stack 12 having been formed prior to formation of the gate spacers. The gate stack 12 includes a high-k dielectric 108 that covers the channel region 116, and an electrically conductive gate 104 formed on an upper surface of the high-k dielectric 108. The high-k dielectric can be formed from various high-k materials such as $HfO_2$, for example. The gate conductor 104 has a thickness (e.g. extending along the X-axis) ranging, for example, from approximately 15 nm to approximately 80 nm. As described, above the gate conductor 104 can be formed from various conductive fill materials such as, for example, tungsten (W), polycrystalline or amorphous silicon, germanium, silicon germanium, a metal (e.g., titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition. The gate conductor may further include a workfunction setting layer. The work function layer may be a nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof.

Figure 10:
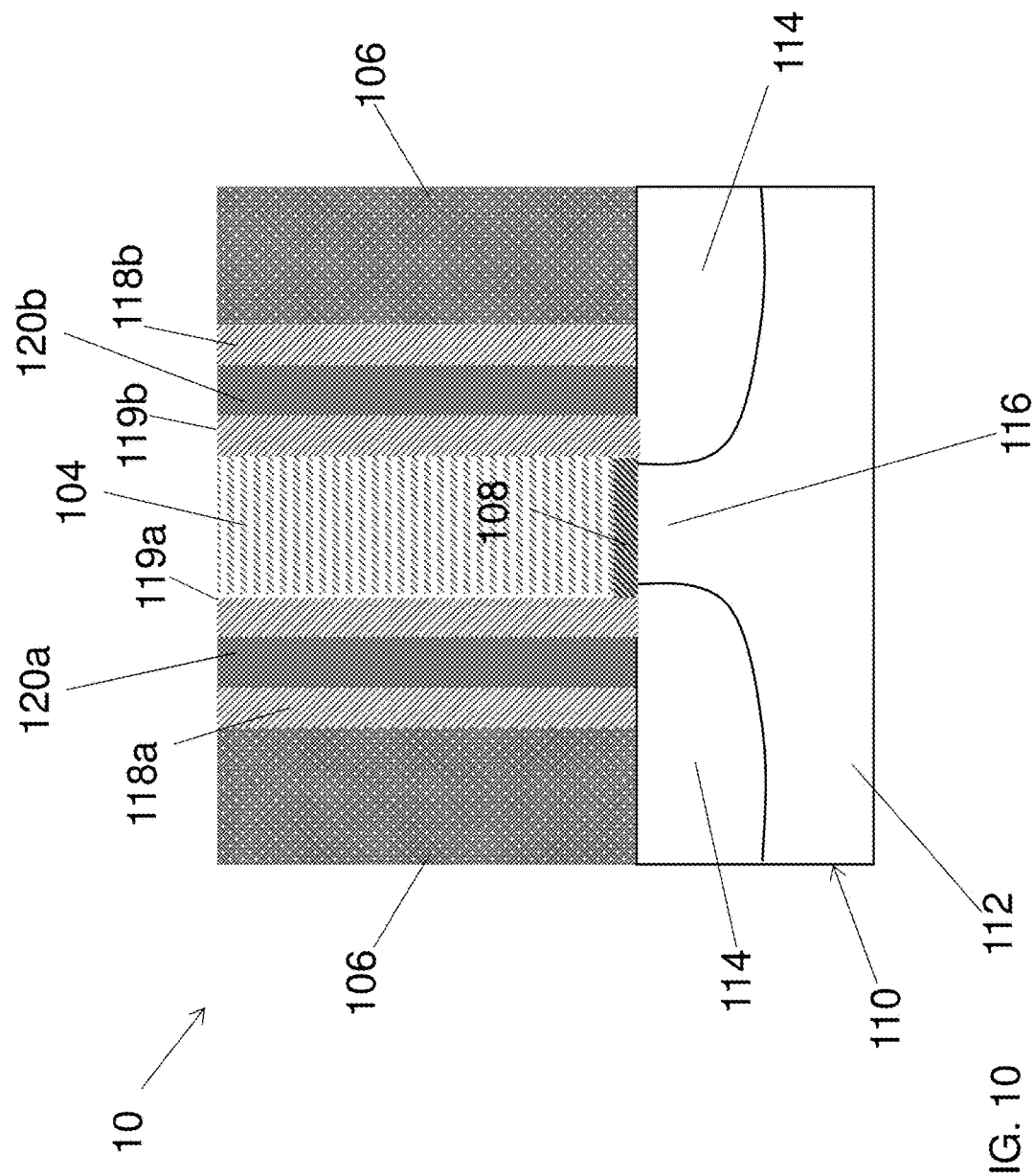

Turning to FIG. 10, an intermediate semiconductor device 10 is illustrated having gate spacers 120 formed between a respective pair of ILDs. For instance, a first gate spacer 120a is formed between a first ILD 118a and a second ILD 119a. Similarly, a second gate spacer 120b is formed between a first ILD 118b and a second ILD 119b. Unlike the embodiments described above, at least one embodiment illustrated in FIG. 10 replaces the high-k material formed on sidewalls of the gate conductor 104 with a second ILD 119a-119b. The ILDs 118a-118b and 119a-119b can be formed from various low-k materials including, but not limited to, SiN.

Figure 11:
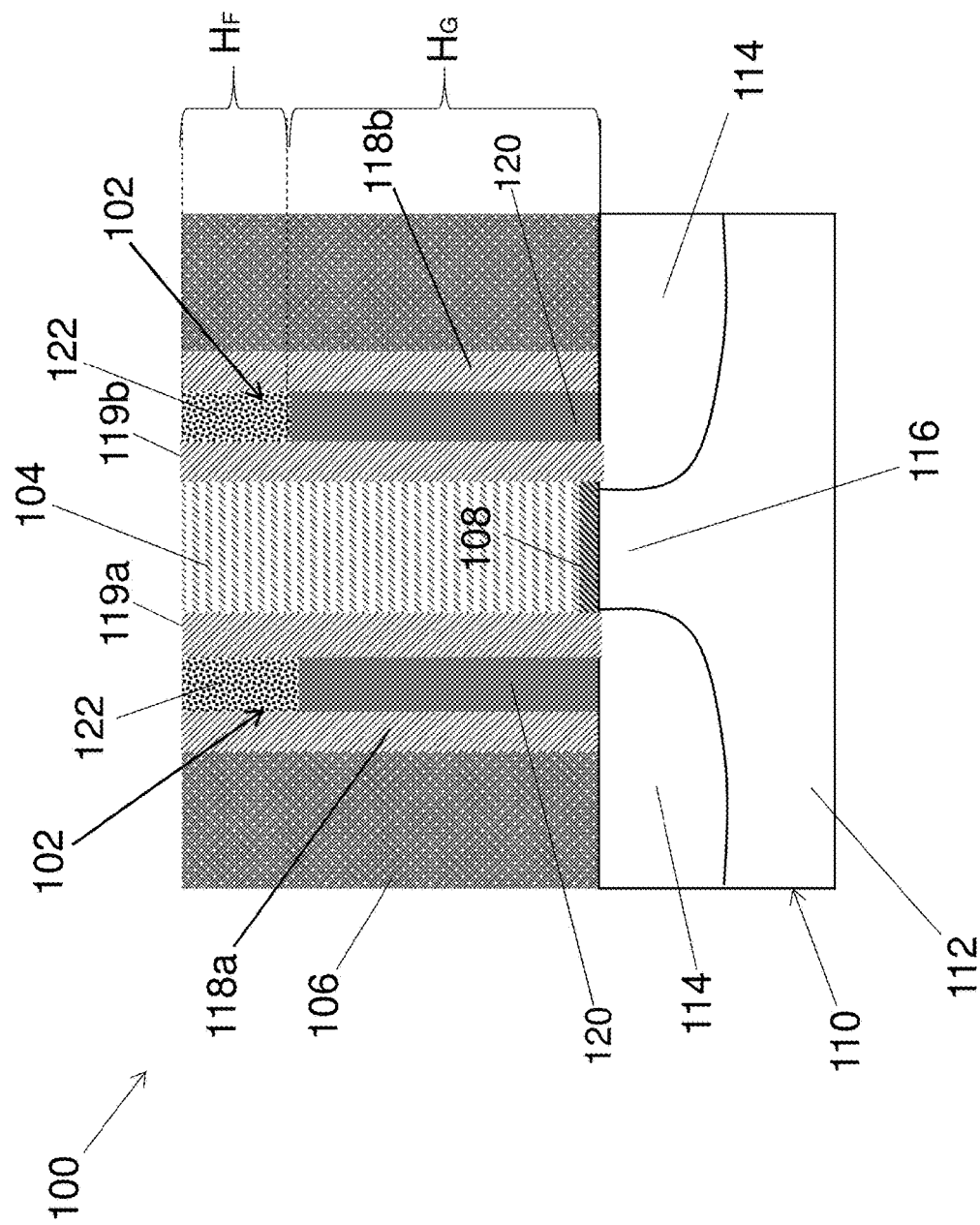

Referring now to FIG. 11, a completed semiconductor device 100 (e.g., FET 100) is illustrated after replacing a portion of the gate spacers 120-120ba with a ferroelectric material to form the dielectric stack layer 120 and the ferroelectric stack layer 122. Various techniques described above can be performed to form the ferroelectric stack layer 122 atop the dielectric stack layer 120. Accordingly, a semiconductor device 100 including enhanced low-k spacer stacks 102 interposed between opposing ILDs 118a-119a and 118b-119b can be fabricated following a gate-first process without departing from the scope of the invention as described herein.

As will thus be appreciated, the above described non-limiting embodiments provide a semiconductor device such as a FET, for example, having an enhanced low-k spacer that reduces parasitic capacitance compared to conventional FETs. In one or more non-limiting embodiments, the semiconductor device includes a low-k spacer stack interposed between an electrically conductive gate and one or more electrically conductive S/D contacts. The low-k spacer stack includes a ferroelectric material that provides an effective dielectric constant substantially lower than those provided by conventional dielectric materials, and even lower than the dielectric constant of air (i.e., k=1). In this manner, the semiconductor device provided by the teachings described herein realizes substantially reduced parasitic capacitance compared to conventional semiconductor devices and FETs.

The descriptions of the various embodiments of the present invention have been presented for purposes of illustration, but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device comprising:
   a semiconductor substrate including a channel region and a source/drain region;
   an electrically conductive gate on an upper surface of the channel region;
   an electrically conductive source/drain contact on an upper surface of the source/drain region; and
   an enhanced low-k spacer on an upper surface of the substrate and interposed between the electrically conductive gate and the electrically conductive source/drain contact;
   wherein the enhanced low-k spacer includes a stacked arrangement of a dielectric material and a ferroelectric material.

2. The semiconductor device of claim 1, wherein the enhanced low-k spacer has a dielectric constant less than k=1.

3. The semiconductor device of claim 2, wherein the enhanced low-k spacer includes a dielectric stack layer comprising the dielectric material on an upper surface of the substrate, and a ferroelectric stack layer comprising the ferroelectric material on an upper surface of the dielectric stack layer.

4. The semiconductor device of claim 3, wherein the dielectric stack layer has a first total height and the ferroelectric stack layer has a second height that is greater than the first height.

5. The semiconductor device of claim 3, wherein the dielectric stack layer has a first total height and the ferroelectric stack layer has a second height that is less than the first height.

6. The semiconductor device of claim 2, wherein the ferroelectric material comprises hafnium zirconium oxide ($HfZrO_2$), and the dielectric material comprises a dielectric ceramic material selected from the group comprising SiBCN and SiOCN.

7. The semiconductor device of claim 3, further comprising:
   an inter-layer dielectric interposed between the electrically conductive source/drain contact and a first side of the enhanced low-k spacer; and
   a gate dielectric layer interposed between the electrically conductive gate and a second side of the enhanced low-k spacer that is opposite the first side,
   wherein the inter-layer dielectric comprises a low-k dielectric material and the gate dielectric layer comprises a high-k dielectric material.

8. The semiconductor device of claim 3, further comprising:
   a first inter-layer dielectric interposed between the electrically conductive source/drain contact and a first side of the enhanced low-k spacer; and
   a second inter-layer dielectric interposed between the electrically conductive gate and a second side of the enhanced low-k spacer that is opposite the first side,
   wherein the first and second inter-layer dielectrics each comprises a low-k dielectric material.

9. A field effect transistor (FET) including enhanced low-k spacers, the FET comprising:
   a semiconductor substrate including a channel region interposed between a first source/drain region and a second source/drain region;
   an electrically conductive gate on an upper surface of the channel region;
   a first electrically conductive source/drain contact on an upper surface of the first source/drain region, and a second electrically conductive source/drain contact on an upper surface of the second source/drain region;
   a first stacked arrangement of a dielectric material and a ferroelectric material interposed between the first electrically conductive source/drain contact and the electrically conductive gate that defines a first enhanced low-k spacer; and
   a second stacked arrangement of a dielectric material and a ferroelectric material interposed between the second electrically conductive source/drain contact and the electrically conductive gate that defines a second enhanced low-k spacer.

10. The FET of claim 9, wherein the first and second enhanced low-k spacers have a dielectric constant less than k=1.

11. The FET of claim 10, wherein the first and second enhanced low-k spacers each include a dielectric stack layer comprising the dielectric material on an upper surface of the substrate, and a ferroelectric stack layer comprising the ferroelectric material on an upper surface of the dielectric stack layer.

12. The FET of claim 11, wherein the dielectric stack layer has a first total height and the ferroelectric stack layer has a second height that is greater than the first height.

13. The FET of claim 11, wherein the dielectric stack layer has a first total height and the ferroelectric stack layer has a second height that is less than the first height.

14. The FET of claim 10, wherein the ferroelectric material comprises hafnium zirconium oxide ($HfZrO_2$), and the dielectric material comprises a dielectric ceramic material selected from the group comprising SiBCN and SiOCN.

15. The FET of claim 11, further comprising:
   a first inter-layer dielectric interposed between the first electrically conductive source/drain contact and a first side of the first enhanced low-k spacer, and a second inter-layer dielectric interposed between the second electrically conductive source/drain contact a first side of the second enhanced low-k spacer; and
   a first gate dielectric layer interposed between the electrically conductive gate and a second side of the first enhanced low-k spacer that is opposite the first side of the first enhanced low-k spacer, and a second gate dielectric layer interposed between the electrically conductive gate and a second side of the second enhanced low-k spacer that is opposite the first side of the second enhanced low-k spacer.

16. A method of fabricating a semiconductor device including an enhanced low-k spacer, the method comprising:
   forming a semiconductor substrate including a channel region and a source/drain region;
   forming an electrically conductive gate on an upper surface of the channel region;

forming an electrically conductive source/drain contact on an upper surface of the source/drain region; and stacking together a dielectric material and a ferroelectric material between the electrically conductive gate and the electrically conductive source/drain contact to form the enhanced low-k spacer.

17. The method of claim 16, wherein the stacking comprises:

depositing the dielectric material on an upper surface of the semiconductor substrate to form a dielectric stack layer; and depositing the ferroelectric material on an upper surface of the dielectric stack layer to form a ferroelectric stack layer.

18. The method of claim 17, further comprising adjusting a height of the ferroelectric stack layer with respect to the dielectric stack layer such that a dielectric constant of the enhanced low-k spacer is less than k=1.

19. The method of claim 17, wherein the dielectric stack layer has a first total height and the ferroelectric stack layer has a second height that is greater than the first height.

20. The method of claim 17, wherein the dielectric stack layer has a first total height and the ferroelectric stack layer has a second height that is less than the first height.

* * * * *